United States Patent
Yu et al.

(10) Patent No.: US 10,153,205 B2
(45) Date of Patent: Dec. 11, 2018

(54) PACKAGE WITH METAL-INSULATOR-METAL CAPACITOR AND METHOD OF MANUFACTURING THE SAME

(71) Applicant: Taiwan Semiconductor Manufacturing Co., Ltd., Hsin-Chu (TW)

(72) Inventors: Chen-Hua Yu, Hsinchu (TW); Shang-Yun Hou, Jubei (TW); Wen-Chih Chiou, Zhunan Township (TW); Jui-Pin Hung, Hsinchu (TW); Der-Chyang Yeh, Hsin-Chu (TW); Chiung-Han Yeh, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 185 days.

(21) Appl. No.: 14/990,976

(22) Filed: Jan. 8, 2016

(65) Prior Publication Data
US 2016/0118301 A1   Apr. 28, 2016

Related U.S. Application Data

(62) Division of application No. 13/764,197, filed on Feb. 11, 2013, now Pat. No. 9,263,511.

(51) Int. Cl.
*H01L 21/78* (2006.01)
*H01L 49/02* (2006.01)
(Continued)

(52) U.S. Cl.
CPC .......... *H01L 21/78* (2013.01); *H01L 21/4853* (2013.01); *H01L 21/565* (2013.01);
(Continued)

(58) Field of Classification Search
CPC . H01L 23/3128; H01L 23/5223; H01L 21/78; H01L 27/1255; H01L 27/3276; H05K 1/162
See application file for complete search history.

(56) References Cited

U.S. PATENT DOCUMENTS 5,479,316 A    12/1995 Smrtic
5,563,762 A    10/1996 Leung et al.
(Continued)

OTHER PUBLICATIONS

Non-Final Office Action dated Aug. 1, 2014 for U.S. Appl. No. 13/764,197.
(Continued)

*Primary Examiner* — Jose R Diaz
(74) *Attorney, Agent, or Firm* — Eschweiler & Potashnik, LLC

(57) ABSTRACT

A package includes a chip that has a metal-insulator-metal (MIM) capacitor formed in a first polymer layer and a metallic pillar formed on the MIM capacitor. A molding compound surrounds the chip, a second polymer layer is formed on the chip and the molding compound, a third polymer layer is formed on the second polymer layer, an interconnect structure is formed between the second polymer layer and the third polymer layer and electrically coupled to the metallic pillar and the MIM capacitor, and a bump is formed over and electrically coupled to the interconnect structure.

20 Claims, 8 Drawing Sheets

(51) Int. Cl.
| | |
|---|---|
| *H01L 27/12* | (2006.01) |
| *H01L 27/32* | (2006.01) |
| *H01L 23/00* | (2006.01) |
| *H01L 23/522* | (2006.01) |
| *H01L 21/48* | (2006.01) |
| *H01L 21/56* | (2006.01) |
| *H01L 25/00* | (2006.01) |
| *H01L 23/525* | (2006.01) |

(52) U.S. Cl.
CPC .......... *H01L 23/5223* (2013.01); *H01L 24/19* (2013.01); *H01L 24/96* (2013.01); *H01L 24/97* (2013.01); *H01L 25/50* (2013.01); *H01L 27/1255* (2013.01); *H01L 27/3276* (2013.01); *H01L 28/40* (2013.01); *H01L 28/60* (2013.01); *H01L 23/525* (2013.01); *H01L 2224/04105* (2013.01); *H01L 2224/12105* (2013.01); *H01L 2224/97* (2013.01); *H01L 2924/181* (2013.01); *H01L 2924/18162* (2013.01); *H01L 2924/19041* (2013.01); *H01L 2924/19104* (2013.01)

(56) References Cited

U.S. PATENT DOCUMENTS

| | | | |
|---|---|---|---|
| 5,822,175 A | 10/1998 | Azuma | |
| 6,316,837 B1 | 11/2001 | Song | |
| 6,404,615 B1 | 6/2002 | Wijeyesekera et al. | |
| 6,455,408 B1 | 9/2002 | Hwang et al. | |
| 6,927,142 B2 | 8/2005 | Lee et al. | |
| 7,288,799 B2 | 10/2007 | Saigoh et al. | |
| 7,294,544 B1 | 11/2007 | Ho et al. | |
| 7,777,300 B2 | 8/2010 | Tews et al. | |
| 8,124,490 B2 * | 2/2012 | Lin | H01G 4/228 257/E21.02 |
| 8,624,353 B2 | 1/2014 | Lin et al. | |
| 8,778,737 B2 * | 7/2014 | Cooney, III | H01L 23/5223 438/118 |
| 2003/0219956 A1 * | 11/2003 | Mori | H05K 1/162 438/393 |
| 2004/0079980 A1 | 4/2004 | Hieda | |
| 2007/0262457 A1 | 11/2007 | Lin | |
| 2008/0157316 A1 | 7/2008 | Yang | |
| 2009/0073633 A1 * | 3/2009 | Tews | H01L 23/5223 361/301.1 |
| 2012/0001328 A1 * | 1/2012 | Chang | H01L 23/3128 257/738 |

OTHER PUBLICATIONS

Non-Final Office Action dated Mar. 27, 2015 for U.S. Appl. No. 13/764,197.
Notice of Allowance dated Oct. 7, 2015 for U.S. Appl. No. 13/764,197.

* cited by examiner

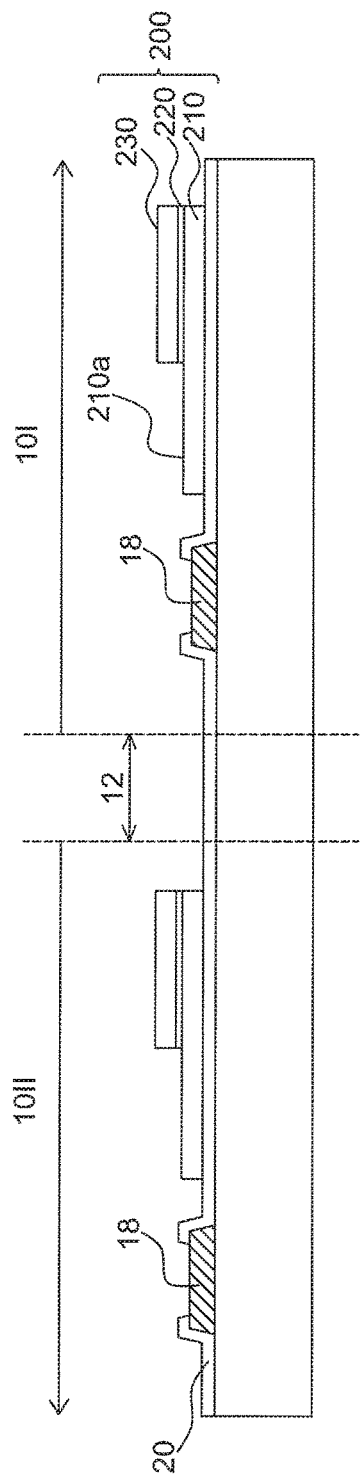
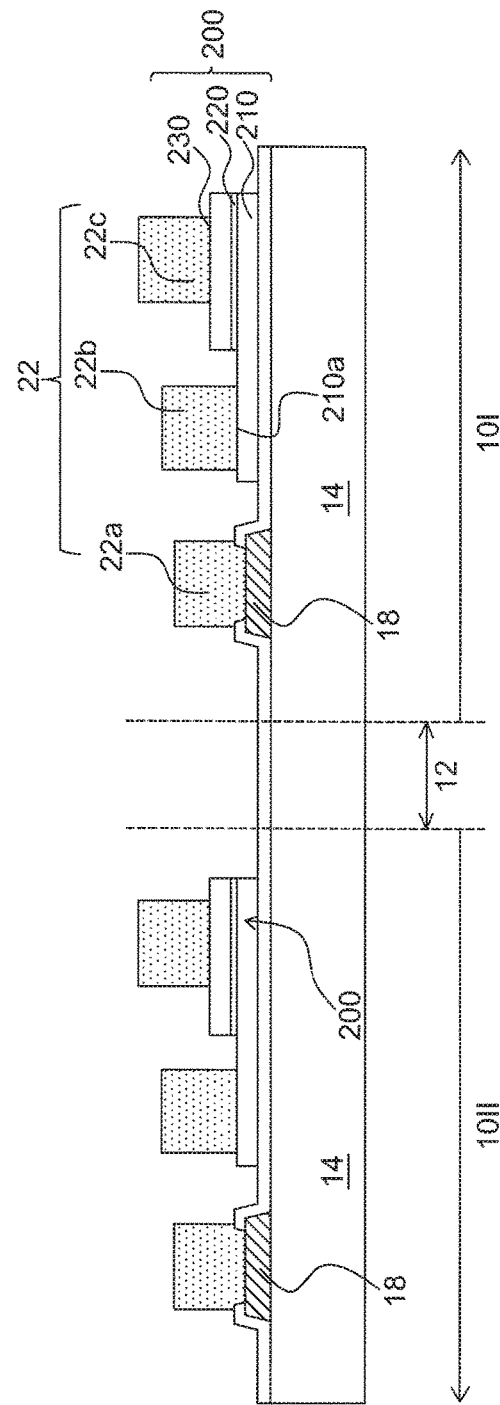

PACKAGE WITH METAL-INSULATOR-METAL CAPACITOR AND METHOD OF MANUFACTURING THE SAME

REFERENCE TO RELATED APPLICATION

This Application is a Divisional of U.S. application Ser. No. 13/764,197 filed on Feb. 11, 2013, the contents of which are incorporated by reference in their entirety.

FIELD

This disclosure relates to packages and methods of manufacturing the packages, and more particularly to packages with metal-insulator-metal (MIM) capacitors and methods of manufacturing the same.

BACKGROUND

Radio frequency (RF) and mixed-signal integrated circuits employ capacitor elements for decoupling, filtering and oscillating. Metal-insulator-metal (MIM) capacitor structure has been used as a capacitor in analog, mixed-signal and RF devices, due to an advantage that metal provides depletion-free, high-conductance electrodes suitable for high-speed applications at low cost. The MIM capacitor structure has an advantage of flexibility in inserting it between two intermediate metal levels. For increasingly complex mixed-signal and RF applications, the MIM capacitor area is limited by chip size parameters.

BRIEF DESCRIPTION OF THE DRAWINGS

FIGS. 2-11 are cross-sectional views of a package at various stages of a method of manufacturing the package with a metal-insulator-metal (MIM) capacitor according to one or more embodiments.

DETAILED DESCRIPTION

Figure 1A:
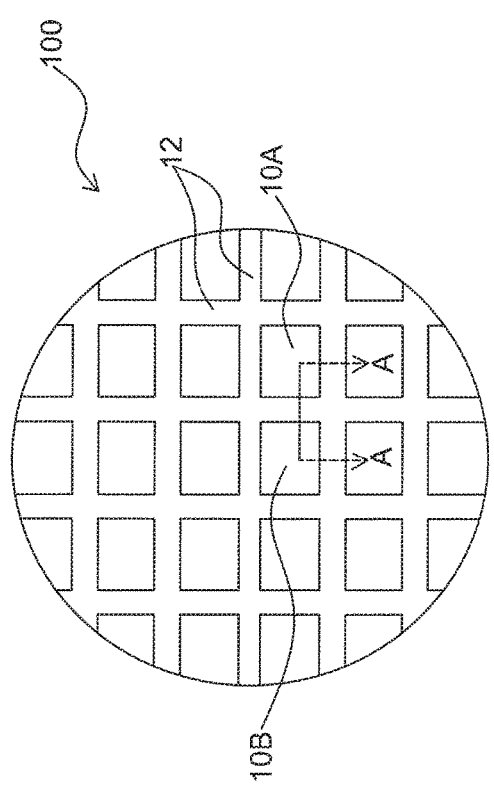
FIG. 1A is a top view of the semiconductor wafer with chips for manufacturing a package according to one or more embodiments.

It is to be understood that the following disclosure provides many different embodiments or examples, for implementing different features of various embodiments. Specific examples of components and arrangements are described below to simplify the present disclosure. The present disclosure may, however, be embodied in many different forms and should not be construed as being limited to the embodiments set forth herein; rather, these embodiments are provided so that this description will be thorough and complete, and will fully convey the present disclosure to those of ordinary skill in the art. It will be apparent, however, that one or more embodiments may be practiced without these specific details.

In the drawings, the thickness and width of layers and regions are exaggerated for clarity. Like reference numerals in the drawings denote like elements. The elements and regions illustrated in the figures are schematic in nature, and thus relative sizes or intervals illustrated in the figures are not intended to limit the scope of the present disclosure.

FIGS. 2-11 are cross-sectional views of a package at various stages of a method of manufacturing the package with a metal-insulator-metal (MIM) capacitor according one or more embodiments.

Figure 1B:
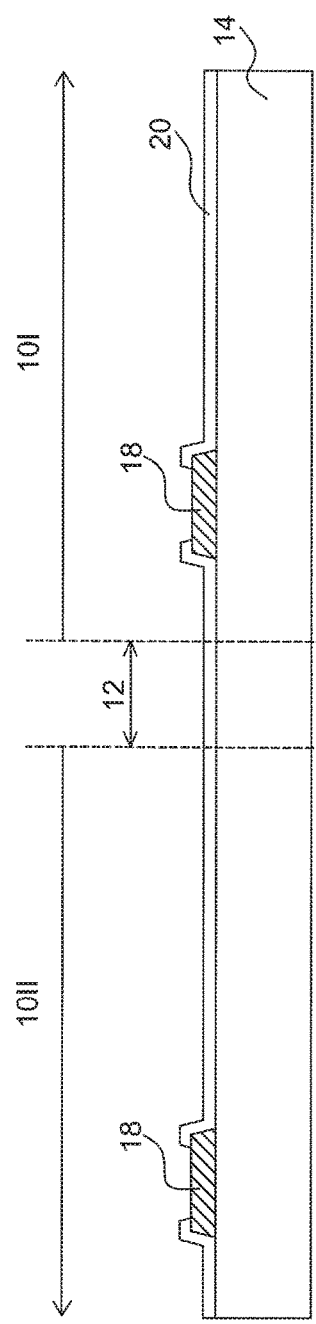
FIG. 1B is a cross-sectional view taken along the line A-A shown in FIG. 1A.

With reference to FIG. 1A and FIG. 1B, a semiconductor wafer 100 including a plurality of chips (or dies) with electrical circuitry and contact pads manufactured thereon is provided. FIG. 1A is a top view of the semiconductor wafer 100 including chips 10A and 10 B according to at least one embodiment, and FIG. 1B is a cross-sectional view taken along the line A-A shown in FIG. 1A. The semiconductor wafer 100 comprises an array of chips separated from each other by two sets of intersecting scribe line regions 12. One set of scribe line regions 12 extend along a first direction and a second set of scribe line regions 12 extend along a second direction. In accordance with at least one embodiment, the chips 10A and 10B have a substantially identical structure. The cross-section view illustrates chip 10A formed on a first chip region 10I and chip 10B formed a second chip region 10II, and the chip regions 10I and 10II are separated by the scribe line region 12. The structures of the chips 10A and 10B formed on the chips regions 10I and 10II are described in detail below.

In manufacturing the chips 10A and 10B, semiconductor processes are performed on a semiconductor substrate 14 to form contact pads 18 and a passivation layer 20. In some embodiments, additional features such as electrical circuitry, dielectric layer, metal lines and other suitable features are also formed. The semiconductor substrate 14 may include, for example, bulk silicon, doped or undoped, or an active layer of a semiconductor-on-insulator (SOI) substrate. Other substrates, such as a multi-layered or gradient substrate may also be used. The electrical circuitry (not shown) formed in the semiconductor substrate 14 may be any type of circuitry suitable for a particular application. In some embodiments, the electrical circuitry includes electrical devices having one or more dielectric layers overlying the electrical devices. Metal layers may be formed between dielectric layers to route electrical signals between the electrical devices. Electrical devices may also be formed in one or more dielectric layers. For example, the electrical circuitry may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may executed using various structures including memory structures, processing structures, sensors, amplifiers, power distribution, input/output circuitry, or the like. One of ordinary skill in the art will appreciate that the above examples are provided for illustrative purposes only to further explain applications of some illustrative embodiments and are not meant to limit the disclosure in any manner. Other circuitry may be used as appropriate for a given application. A plurality of dielectric layers and metal lines (not shown) are formed on the electrical circuitry. The dielectric layers may be formed, for example, of a low dielectric constant (low-K) dielectric material, such as phosphosilicate glass (PSG), borophosphosilicate glass (BPSG), fluorinated silicate glass (FSG), $SiO_xC_y$, Spin-On-Glass, Spin-On-Polymers, silicon carbon material, compounds thereof, composites thereof, combinations thereof, or the like, by any suitable method, such as spinning, chemical vapor deposition (CVD), and/or plasma-enhanced CVD (PECVD). Metal lines and/or vias may be formed inside the dielectric layer to provide an electrical connection to the electrical circuitry formed in the semiconductor substrate 14. In some embodiments, the uppermost dielectric layer is formed of a dielectric material, such as silicon nitride, silicon oxide, undoped silicon glass, and the like.

The contact pads 18 are formed on the uppermost dielectric layer of the semiconductor substrate 14 to electrically connect the metal lines or vias inside the dielectric layers. In some embodiments, the contact pads 18 are formed of aluminum, aluminum copper, aluminum alloys, copper, copper alloys, or the like. One or more passivation layers 20 are formed over the semiconductor substrate 14 and patterned to expose at least a portion of each contact pad 18. In some embodiments, the passivation layer 20 is formed of a dielectric material, such as undoped silicate glass (USG), silicon nitride, silicon oxide, silicon oxynitride or a non-porous material. In some embodiments, the passivation layer 20 is formed by chemical vapor deposition (CVD), physical vapor deposition (PVD), or any other suitable process. In at least one embodiment, the passivation layer 20 is formed to cover a peripheral portion of each contact pad 18, and to expose a central portion of each contact pad 18 through openings in the passivation layer 20. The passivation layer 20 may be a single layer or a laminated multi-layer structure.

Referring to FIG. 2, metal-insulator-metal (MIM) capacitors 200 are formed on the passivation layer 20 adjacent to the contact pads 18 within the chip regions 10I and 10II respectively. The MIM capacitor 200 is not formed over the contact pad 18 according to some embodiments. In at least one embodiment, the MIM capacitor 200 includes a lower metal layer 210, an upper metal layer 230 and a capacitor dielectric layer 220 formed between the metal layers 210 and 230. The lower metal layer 210 includes an extending portion 210a not covered by the upper metal layer 230 and the capacitor dielectric layer 220, in accordance with some embodiments. The lower metal layer 210 may include a titanium (Ti) layer, a titanium nitride (TiN) layer, a tatanium (Ta) layer, a tatanium nitride (TaN) layer, or combinations thereof. The upper metal layer 230 may include a titanium (Ti) layer, a titanium nitride (TiN) layer, or combinations thereof. In some embodiments, the lower metal layer 210 has a thickness between about 500 Angstroms and about 1500 Angstroms, and the upper metal layer 230 has a thickness between about 500 Angstroms and about 1500 Angstroms. The capacitor dielectric layer 220 may include a nitride layer, a silicon nitride layer, or other dielectric material layers of high dielectric constant. In some embodiments, the capacitor dielectric layer 220 is a silicon nitride layer deposited by low-temperature CVD or plasma-enhanced CVD (PECVD) methods. In some embodiments, the capacitor dielectric layer 220 is a silicon nitride layer of a thickness of about 250 Angstroms or less formed by a PECVD method at a process temperature less than about 200 degree Celsius, thereby achieving an enhanced capacitance density in the MIM capacitor 200 greater than about 2 $fF/cm^2$. In at least one exemplary embodiment, the formation of the MIM capacitor 200 includes the step of forming the lower metal layer 210 on the passivation layer 20 by a combination of depositing, photolithography and etching methods. The capacitor dielectric layer 220 and the upper metal layer 230 are successively deposited on the resulted surface followed by photolithography and etching processes such that the capacitor dielectric layer 220 and the upper metal layer 230 are formed on the lower metal layer 210.

Referring to FIG. 3, a plurality of metallic pillars 22 (such as 22a, 22b and 22c) is formed on portions of conductive regions within the chip regions 10I and 10II. In some embodiments, the metallic pillar 22a is formed on the exposed portion of the contact pads 18, the metallic pillar 22b is formed on the extending portion 210a of the lower metal layer 210, and the metallic pillar 22c is formed on an exposed portion of the upper metal layer 230. In some embodiments, each metallic pillar 22 is formed of copper, copper alloys, aluminum, aluminum alloys, gold, gold alloy, or the like. In some embodiments, the metallic pillar 22 includes a layer comprising substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum, cobalt or zirconium. The metallic pillars 22 make electrical contact with the contact pads 18 and the MIM capacitors 200. The metallic pillar 22 is formed, for example through photoresist masking, photolithography, plating, and photoresist stripping processes.

Figure 4:
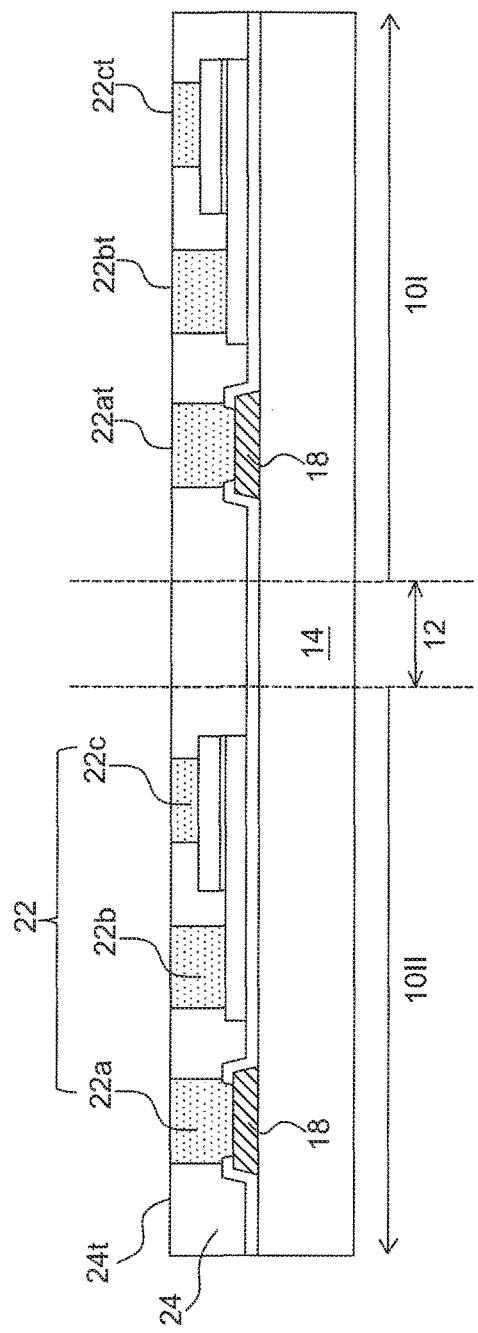
Figure 5:
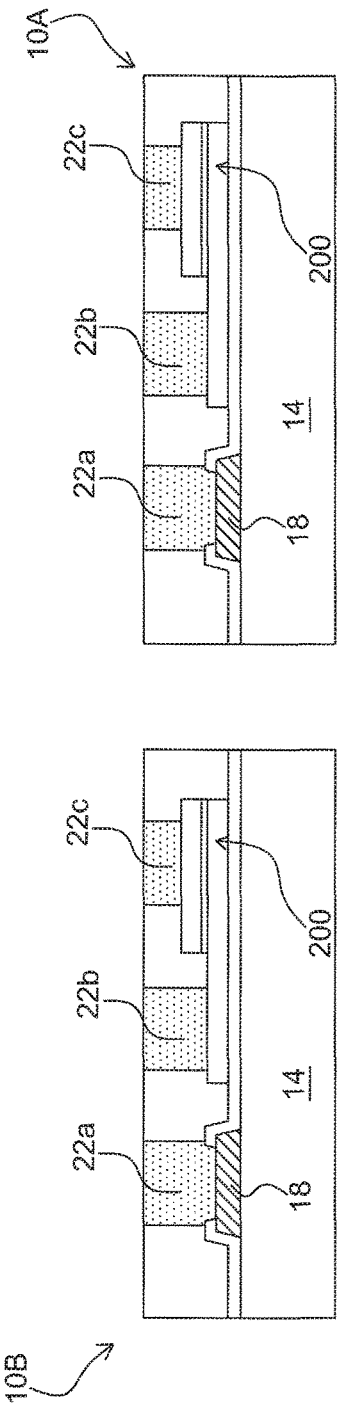

Referring to FIG. 4, a first polymer layer 24 is provided on the resulted wafer 100 to cover the metallic pillars 22 and fill spaces between the metallic pillars 22, and then a grinding step is performed to remove the first polymer layer 24 to expose the metallic pillars 22a, 22b and 22c. Exposed surfaces 22at, 22bt and 22ct are part of the metallic pillars 22a, 22b and 22c, respectively. The first polymer layer 24 may be a single layer or a laminated multi-layer structure. In some embodiments, the first polymer layer 24 is formed of epoxy, polyimide, benzocyclobutene (BCB), polybenzoxazole (PBO), or the like, although other relatively soft, often organic, dielectric materials can also be used. The grinding step may be performed by a chemical mechanical polishing (CMP) process, a dry etching process, a wet etching process or another removing process. In some embodiments, the exposed surfaces 22at, 22bt and 22ct of the metallic pillars 22a, 22b and 22c are substantially co-planar with a top surface 24t of the polymer layer 24. The grinding step may reduce the thicknesses of the metallic pillars 22 and make the metallic pillars 22a, 22b and 22c have different thickness T1, T2 and T3. In some embodiments, T1 is greater than or equal to T2, and T2 is greater than T3. In at least one exemplary embodiment, the thickness T1 is less than about 40 μm. In at least another exemplary embodiment, the thickness T1 is less than about 20 μm, although the thickness may be greater or smaller. Next, the wafer 100 is singulated (or sawed) into individual chips 10A and 10B as shown in FIG. 5, in accordance with some embodiments. For example, a singulation process is performed along the scribe line regions 12 to separate the individual chips 10A and 10B from the wafer 100. Each individual chip 10A or 10B has the MIM capacitor 200 and metallic pillars 22 in the first polymer layer 24. Hereinafter the individual chips 10A and 10B are referred to as chips 10 for subsequent packing processes.

Figure 6:
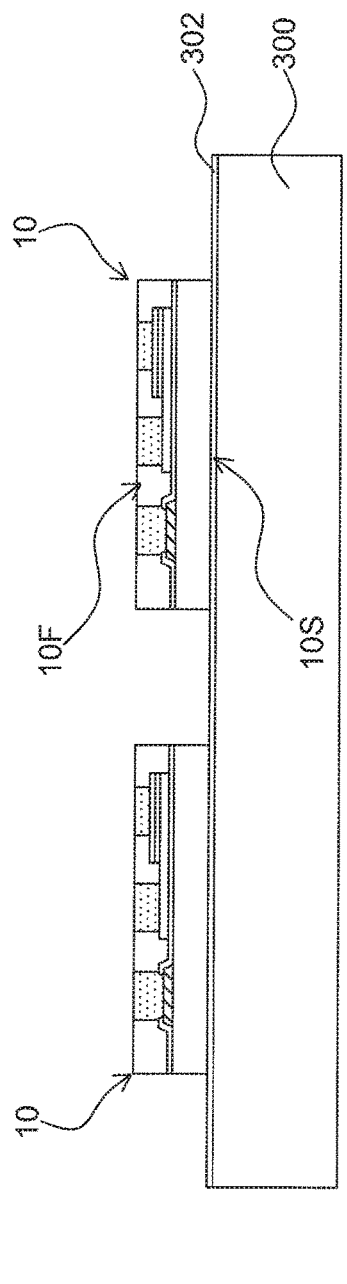

Referring to FIG. 6, at least one chip 10 is attached to a carrier wafer 300 through an adhesive film 302. Several dozen chips 10 or several hundred chips 10 or more may be attached to the carrier wafer 300, depending on a size of the chips 10, a size of carrier wafer 300, and the particular application. The chip 10 has a first side 10F (also referred to herein as a front side 10F) and a second side 10S (also referred to herein as a back side 10S). The chip 10 has the MIM capacitor 200 and metallic pillars 22 in the first polymer layer 24 adjacent to the front side 10F, and the substrate 14 of the chip 10 is adjacent to the back side 10S, in accordance with some embodiments. A pick and place machine may be used to place the chip 10 in predetermined locations on the carrier wafer 300, for example. In some embodiments, the back side 10S of the chip 10 is attached to the adhesive film 302, such that the chip 10 is mounted face-up on the carrier wafer 300.

Figure 7:
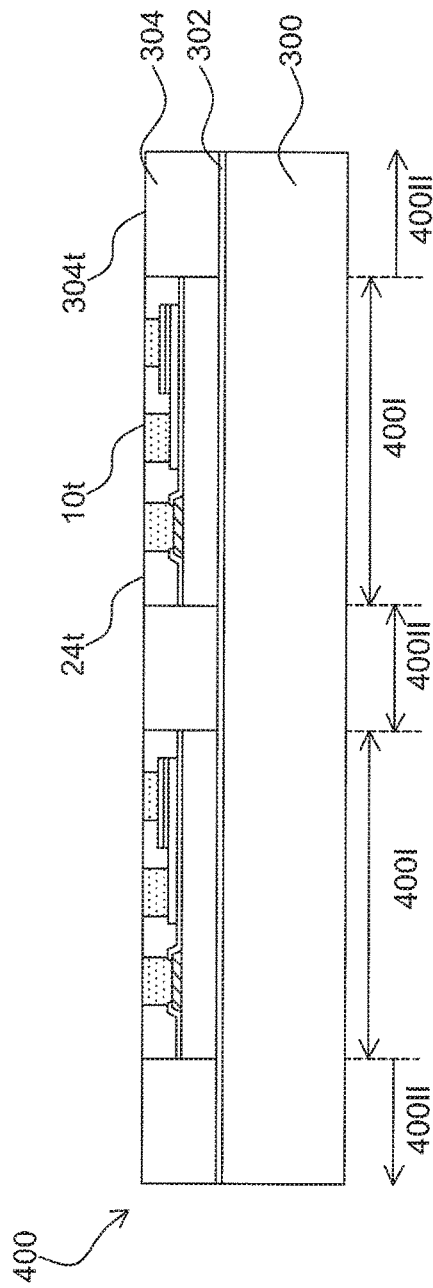

Referring to FIG. 7, a molding compound 304 is formed to fill gaps between the chips 10. In some embodiments, the molding compound 304 is provided over the chips 10 and portions of the adhesive film 302 between the chips 10, and then a grinding process is performed on the molding compound 304 to expose the top surfaces 10t of the front side 10F of chips 10, so that the top surface 304t of the molding compound 304 becomes substantially level with the top surfaces 10t of the chips 10. In some embodiments, the top surface 24t of the first polymer layer 22 is substantially level with the top surface 304t of the molding compound 304. The grinding process may planarize the top surface 10t of the chip 10, so that any unevenness in the top surface 10t of the chip 10 may be at least reduced, and possibly substantially eliminated. Furthermore, a height or thickness of the chip 10 may be reduced to a selected height through the grinding process. This results in a reconstructed wafer 400 that includes first areas 400I (also referred to herein as chip areas 400I) and second areas 400II (also referred to herein as fan-out areas 400II). In some embodiments, the chip 10 is formed on the chip areas 400I, and the molding compound 304 is formed on the fan-out area 400II. Subsequently formed wiring layers can be formed over the molding compound 304 to electrically connect the chip 10.

Figure 8:
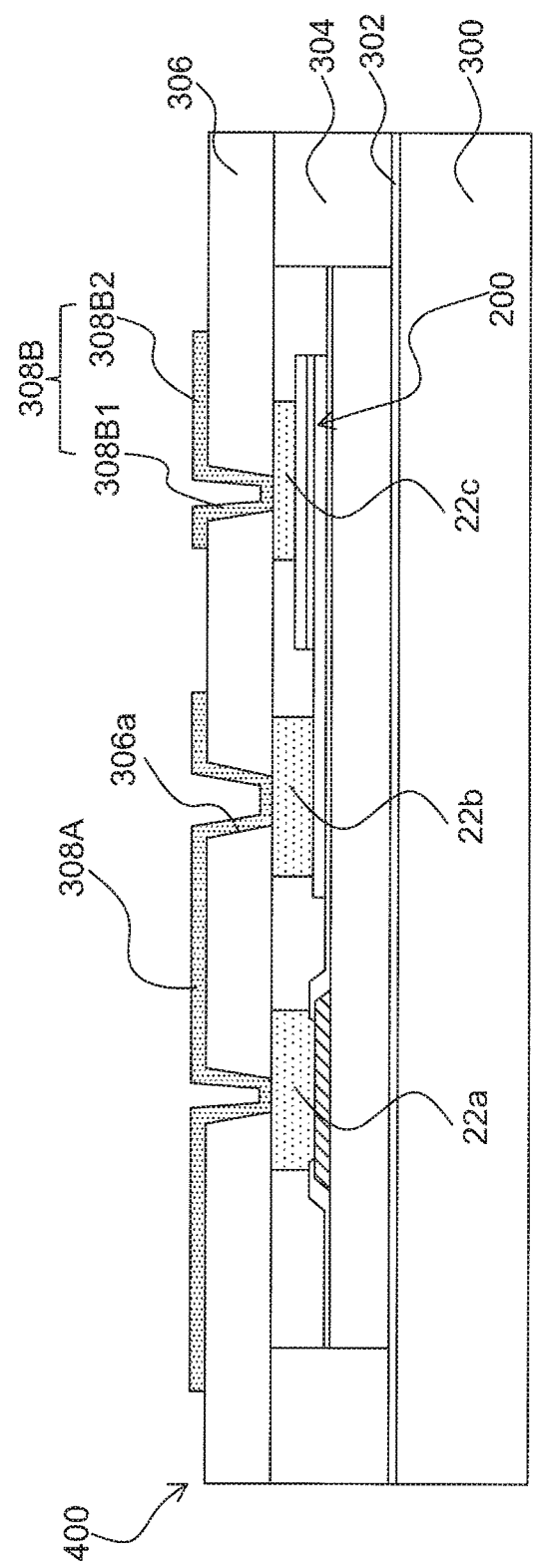

Referring to FIG. 8, a second polymer layer 306 is formed on the reconstructed wafer 400 to cover the chips 10 and the molding compound 304. In some embodiments, the second polymer layer 306 includes a polybenzoxazole (PBO) layer, a polyimide layer, a benzocyclobutene (BCB) layer, an epoxy layer, a photo-sensitive material layer, or another suitable material. In at least one exemplary embodiment, the second polymer layer 306 is formed of low-temperature PBO layer. The second polymer layer 306 can be patterned by photolithography processes to form openings, through which the underlying metallic pillars 22 are exposed. After patterning the second polymer layer 306, a plurality of openings 306a are formed in the second polymer layer 306 to expose the metallic pillars 22, and then post-passivation interconnect (PPI) structures 308 are formed on the resulting structure. The PPI structures 308 can be formed in the openings 306a of the second polymer layer 306 to electrically connect with the metallic pillars 22, and extend to a surface of the second polymer layer 306. In some embodiments, the PPI structures 308 are formed over the chip areas 400I and/or the fan-out areas 400II. In some embodiments, the PPI structures 308 are metallization layers formed of copper, aluminum, copper alloys, or other mobile conductive materials using plating, electroless plating, sputtering, chemical vapor deposition methods with a photoresist mask, or other suitable methods. The PPI structures 308 can function as interconnection layers, power lines, re-distribution lines (RDL), inductors, capacitors or any passive components.

In some embodiments, the PPI structure 308 includes a first part 308A and a second part 308B which may be electrically connected to each other. The first part 308A is also referred to herein as an interconnect line region 308A, and the second part 308B is also referred to herein as a landing region 308B on which a bump feature will be formed in subsequent processes. The embodiment of FIG. 8 shows portions of the interconnect line region 308A positioned over and electrically connecting the metallic pillars 22a and 22b, and the landing region 308B is positioned over and electrically connecting the metallic pillar 22c. The landing region 308B also includes a first portion 308B1 formed in the opening 306a and electrically connecting the metallic pillar 22c, and a second portion 308B2 extending from the first portion 308B1 to the surface of the second polymer layer 306.

Figure 9:
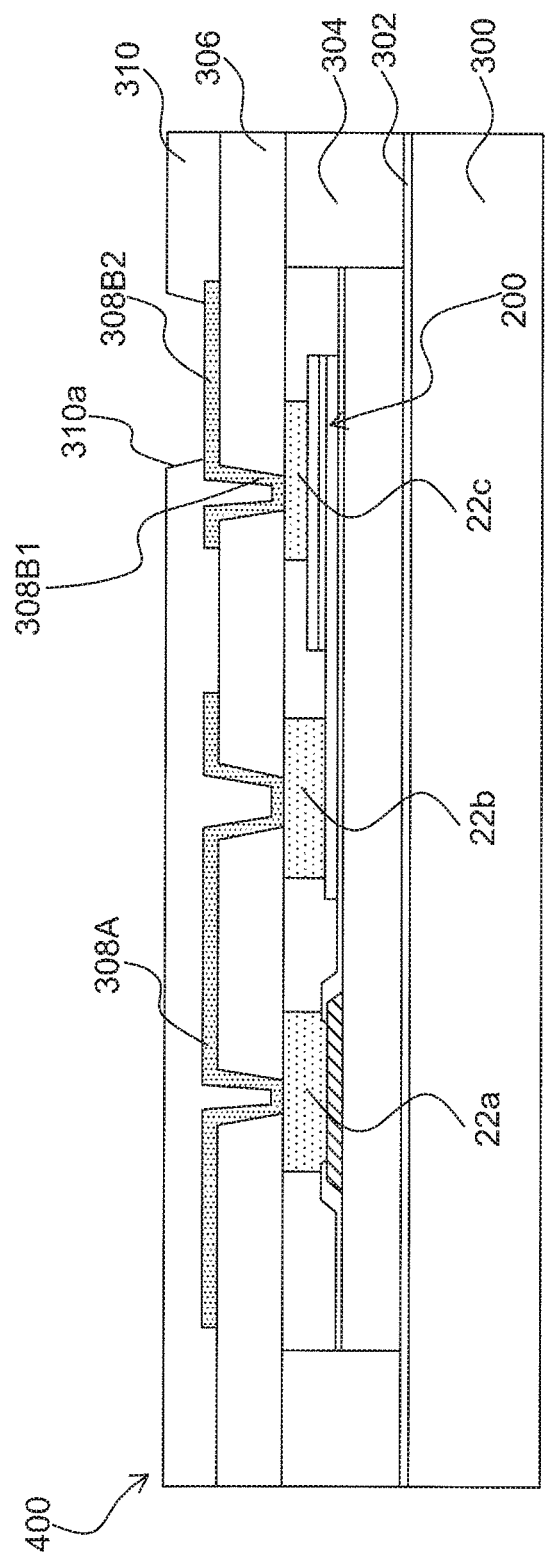

Referring to FIG. 9, a third polymer layer 310 is formed on the second polymer layer 306 and the PPI structures 308. An opening 310a is formed in the third polymer layer 310 to expose a portion of the second portion 308B2 of the landing region 308B. In some embodiments, the third polymer layer 310 includes a polybenzoxazole (PBO) layer, a polyimide layer, a benzocyclobutene (BCB) layer, an epoxy layer, a photo-sensitive material layer, or other suitable material. The third polymer layer 310 may be formed of the same material as the second polymer layer 306. In some embodiments, the third polymer layer 310 is formed of a different material from the second polymer layer 306. The designs on number and location of the opening 310a are flexible according to the bump designs and device performance requests. The embodiment of FIG. 9 shows opening 310a positioned directly over the portion 308B2. In some embodiment, the opening 310a can be formed directly over the portion 308B1.

Figure 10:
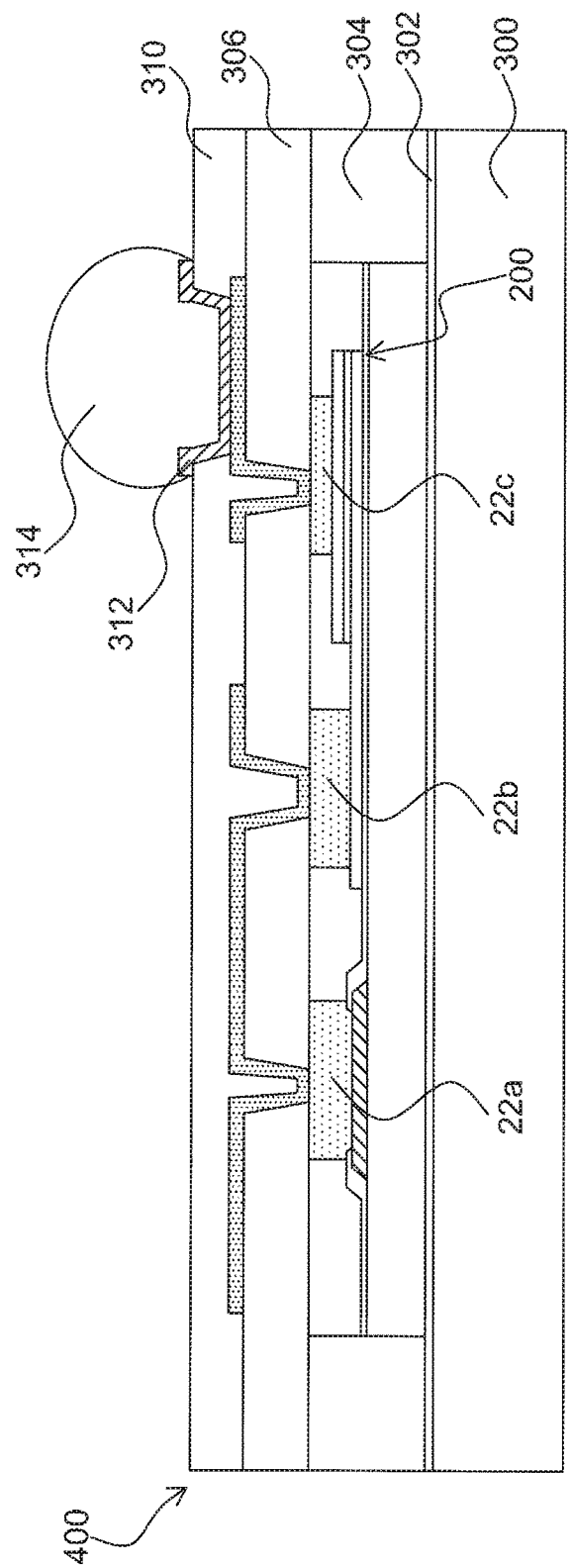

Referring to FIG. 10, an under-bump metallization (UBM) layer 312 is formed in the opening 310a of the third polymer layer 310 to make electrical contact with the landing region 308B2, and a bump 314 is formed on the UBM layers 312. In some embodiments, the UBM layer 312 is formed of copper, copper alloys, aluminum, aluminum alloys, or the like. The UBM layer 312 may be formed as thin layers or pillars. In some embodiments, the bump 314 is a solder bump, a Cu bump, a metal bump including Ni or Au, or combinations thereof. In some embodiments, the bump 314 is a solder bump formed by placing solder balls on the UBM layer 312 and then reflowing the solder balls. In at least one embodiment, the solder bump has a diameter greater than about 200 μm. In some embodiments, the solder bump includes a lead-free pre-solder layer, SnAg, or a solder material including alloys of tin, lead, silver, copper, nickel, bismuth, or combinations thereof. In some embodiments, the solder bump is formed by plating a solder layer using photolithography technologies followed by reflow processes.

Figure 11:
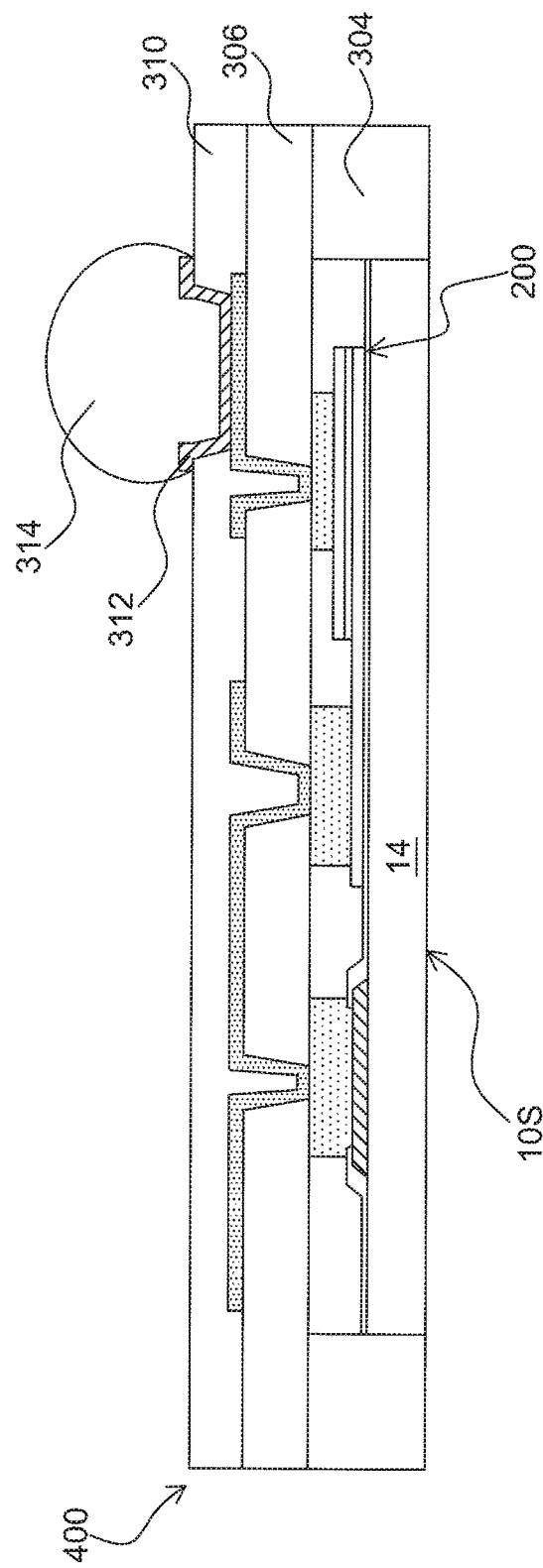

Next, as shown in FIG. 11, The reconstructed wafer 400 is detached from the carrier wafer 300, and sawed into a plurality of individual packages 400P (also referred to herein as fan-out packages). The fan-out package 400P includes at least one chip 10 formed in the chip area 400I, at least one MIM capacitor 200 formed in the chip 10, and fan-out interconnects formed over chip 10 to electrically connect the MIM capacitor 200. The MIM capacitor 200 is formed in the first polymer 24 of the chip 10, in which the upper metal layer 210 electrically connects to the metallic pillar 22c so as to make an electrical connection with the PPI structure 308. The arrangement of the MIM capacitor 200, the metallic pillars 22 and the PPI structure 308 can reduce back-end-of-line (BEOL) routing layers, save silicon area costs and reduce routing resistance. The above described process is applicable to analog, mixed-signal and RF devices.

According to the embodiments, a package includes a chip that has a metal-insulator-metal (MIM) capacitor formed in a first polymer layer and a metallic pillar formed on the MIM capacitor, a molding compound surrounding the chip, a second polymer layer formed on the chip and the molding compound, a third polymer layer formed on the second polymer layer, an interconnect structure formed between the second polymer layer and the third polymer layer and electrically coupled to the metallic pillar and the MIM capacitor, and a bump formed over and electrically coupled to the interconnect structure.

According to some embodiments, a package includes a chip formed in a molding compound. The chip includes a contact pad on a substrate, a passivation layer on the substrate and exposing a portion of the contact pad, a first polymer layer on the passivation layer, a metal-insulator-metal (MIM) capacitor in the first polymer layer, a first metallic pillar in the first polymer layer and over the contact pad, and a second metallic pillar in the first polymer layer and over the MIM capacitor. A first interconnect structure is over the first polymer layer and electrically connecting the first metallic pillar. A second interconnect structure is over the first polymer layer and electrically connecting the second metallic pillar. A bump is formed over and electrically coupled to the second interconnect structure.

According to some embodiments, a method of forming package including: placing a plurality of chips on a carrier wafer, wherein at least one of the chips comprises a metal-insulator-metal (MIM) capacitor formed in a first polymer layer and a metallic pillar formed on the MIM capacitor; forming a molding compound on the carrier wafer to fill gaps between the plurality of chips; forming a second polymer layer on the plurality of chips and the molding compound, wherein the second polymer layer comprises a first opening exposing the metallic pillar; and forming an interconnect structure on the second polymer layer and electrically connecting the metallic pillar through the first opening.

While the present disclosure has been particularly shown and described with reference to example embodiments thereof, a skilled person in the art will appreciate that there can be many embodiment variations of this disclosure. Although the embodiments and their features have been described in detail, it should be understood that various changes, substitutions and alterations can be made herein without departing from the spirit and scope of the embodiments.

The above method embodiments show exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within scope of the disclosure and will be apparent to those skilled in the art after reviewing this disclosure.

The invention claimed is:

1. A method of forming a package, comprising:
   placing a plurality of chips which each include a semiconductor substrate on a carrier wafer, wherein at least one of the chips comprises a metal-insulator-metal (MIM) capacitor disposed directly over dielectric layers and metal lines which route signals between devices in the semiconductor substrate of the chip and which separate a bottom electrode of the MIM capacitor from an upper surface of the semiconductor substrate, and wherein a conformal dielectric passivation layer extends under a lower surface of the bottom electrode and along sidewalls and over an upper surface of a contact pad and separates the bottom electrode of the MIM capacitor from an uppermost of the metal lines, the MIM capacitor being disposed in a first polymer layer over the semiconductor substrate and a metallic pillar disposed on a top electrode of the MIM capacitor, wherein the top electrode has a first width between its outer sidewalls and the metallic pillar has a second width between its outer sidewalls, the second width being less than the first width;
   forming a molding compound on the carrier wafer to fill gaps between the plurality of chips;
   forming a second polymer layer over the molding compound and over the plurality of chips, wherein the second polymer layer comprises a first opening exposing the metallic pillar; and
   forming an interconnect structure over the second polymer layer and electrically connected to the metallic pillar through the first opening.

2. The method of claim 1, further comprising forming a third polymer layer over the second polymer layer, wherein the third polymer layer comprises a second opening exposing the interconnect structure.

3. The method of claim 2, further comprising forming a bump in the second opening of the third polymer layer to make an electrical connection with the interconnect structure.

4. The method of claim 1, wherein the at least one of the chips further comprises:
   a contact pad disposed on the uppermost of the metal lines and electrically coupled to the one or more of the devices in the semiconductor substrate of the chip, wherein the dielectric passivation layer covers the upper surface of the semiconductor substrate and extends upwardly along a sidewall of the contact pad.

5. The method of claim 1, wherein the at least one of the chips further comprises:
   a contact pad disposed on the uppermost of the metal lines and electrically coupled to the one or more of the devices in the semiconductor substrate of the chip, wherein the contact pad is arranged over the semiconductor substrate such that a plane, which is parallel with an upper surface of the semiconductor substrate, traverses both the contact pad and the lower electrode of the MIM capacitor.

6. A method of forming a package, comprising:
   providing a carrier substrate;
   placing a plurality of chips over a surface of the carrier substrate such that neighboring edges of the chips are spaced laterally apart from one another, wherein each of the plurality of chips include a semiconductor substrate with a plurality of metal lines stacked over one another over the semiconductor substrate, wherein a metal-insulator-metal (MIM) capacitor includes a bottom electrode arranged over an uppermost metal line of the plurality of metal lines and a top electrode arranged over the bottom electrode, wherein a first metallic pillar extends downwardly through a first polymer layer to contact an uppermost surface of the top electrode of the MIM capacitor, wherein a second metallic pillar extends downwardly through the first polymer layer to contact an uppermost surface of the bottom electrode, wherein the top electrode has a first lateral width and the metallic pillar has a second lateral width that is less than the first lateral width, and wherein a conformal dielectric passivation layer extends under a lower surface of the bottom electrode and along sidewalls and over an upper surface of a contact pad;
   forming a molding compound over the plurality of chips and between the neighboring edges of the chips;
   forming a second polymer layer over the plurality of chips and over the molding compound, wherein the second polymer layer includes a first opening over the metallic pillar; and forming an interconnect structure over the second polymer layer, wherein the interconnect structure is electrically coupled to the metallic pillar and the MIM capacitor through the first opening.

7. The method of claim 6, further comprising:
forming a third polymer layer over the second polymer layer and over the interconnect structure, wherein the third polymer layer includes a second opening over the interconnect structure; and
forming a bump in the second opening, wherein the bump is electrically coupled to the interconnect structure.

8. The method of claim 6:
wherein the MIM capacitor comprises a lower metal layer, an upper metal layer corresponding to the top electrode, and a capacitor dielectric layer separating the lower metal layer and the upper metal layer, and the upper metal layer substantially covers the capacitor dielectric layer.

9. The method of claim 8, wherein the metallic pillar is formed on the upper metal layer.

10. The method of claim 8, wherein the metallic pillar is formed on an extending portion of the lower metal layer not covered by the upper metal layer and the capacitor dielectric layer.

11. The method of claim 8, wherein the metallic pillar is formed in the first polymer layer and positioned between the interconnect structure and the MIM capacitor.

12. The method of claim 8, wherein the upper metal layer comprises at least one of a titanium layer or a titanium nitride layer.

13. The method of claim 6, wherein the metallic pillar comprises copper or copper alloy.

14. The method of claim 6, wherein the interconnect structure comprises copper or copper alloy.

15. The method of claim 6, wherein a top surface of the chip is level with a top surface of the molding compound.

16. The method of claim 6, further comprising:
detaching the plurality of chips and the molding compound from the carrier substrate; and
after detaching the plurality of chips and the molding compound from the carrier substrate, sawing the plurality of chips into a plurality of individual packages.

17. The method of claim 6, wherein the at least one of the plurality of chips further comprises:
dielectric layers and metal lines which route signals between devices in the semiconductor substrate of the chip and which separate a lower electrode of the MIM capacitor from an upper surface of the semiconductor substrate;
a dielectric passivation layer separating the lower electrode of the MIM capacitor from an uppermost of the metal lines; and
a contact pad disposed on the uppermost of the metal lines and electrically coupled to one or more of the devices in the semiconductor substrate, wherein the dielectric passivation layer covers the uppermost of the metal lines and extends upwardly along a sidewall of the contact pad.

18. A method of forming a package, comprising:
providing a carrier substrate;
placing a plurality of chips each including a semiconductor substrate over a surface of the carrier substrate such that neighboring edges of the chips are spaced laterally apart from one another, wherein a chip includes a metallic pillar extending downwardly through a first polymer layer to contact an upper electrode of a metal-insulator-metal (MIM) capacitor on the chip, wherein the upper electrode has a first lateral width defined between its outermost sidewalls and the metallic pillar has a second lateral width that is less than the first lateral width, wherein the outermost sidewalls of the upper electrode are aligned to outermost sidewalls of a capacitor dielectric separating the upper electrode from a bottom electrode of the MIM capacitor;
forming a molding compound on the carrier substrate to fill gaps between the neighboring edges of the chips;
forming a second polymer layer over the molding compound, wherein the second polymer layer comprises a first opening exposing the metallic pillar;
forming an interconnect structure over the second polymer layer and electrically connected to the metallic pillar through the first opening;
after the interconnect structure has been formed, detaching the carrier substrate from the plurality of chips, the molding compound, the second polymer layer, and the interconnect structure; and
after detaching the carrier substrate, sawing the plurality of chips into a plurality of individual packages.

19. The method of claim 18, wherein prior to detaching the carrier substrate further comprising:
forming a third polymer layer over the second polymer layer and over the interconnect structure, wherein the third polymer layer includes a second opening over the interconnect structure; and
forming a bump in the second opening, wherein the bump is electrically coupled to the interconnect structure.

20. The method of claim 18, wherein the at least one of the chips further comprises:
dielectric layers and metal lines which route signals between devices in the semiconductor substrate of the chip and which separate a lower electrode of the MIM capacitor from an upper surface of the semiconductor substrate;
a dielectric passivation layer separating the lower electrode of the MIM capacitor from an uppermost of the metal lines; and
a contact pad disposed on the uppermost of the metal lines, wherein the dielectric passivation layer covers the uppermost of the metal lines and extends upwardly along a sidewall of the contact pad.

\* \* \* \* \*